US007729126B2

(12) United States Patent
Calhoun et al.

(10) Patent No.: US 7,729,126 B2
(45) Date of Patent: Jun. 1, 2010

(54) MODULAR DIMM CARRIER AND RISER SLOT

(75) Inventors: Michael Bozich Calhoun, Roseville, CA (US); Dennis Carr, Roseville, CA (US); Ricardo Ernesto Espinoza-Ibarra, San Diego, CA (US); Teddy Lee, Roseville, CA (US); Lidia Warnes, Roseville, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 213 days.

(21) Appl. No.: 11/882,263

(22) Filed: Jul. 31, 2007

(65) Prior Publication Data

US 2009/0035978 A1 Feb. 5, 2009

(51) Int. Cl.
*H05K 7/18* (2006.01)

(52) U.S. Cl. .................................... 361/801; 361/798

(58) Field of Classification Search ................ 361/777, 361/798, 800–803; 439/55, 59–62, 327
See application file for complete search history.

(56) References Cited

U.S. PATENT DOCUMENTS 6,202,110 B1 * 3/2001 Coteus et al. ............... 710/301
6,347,039 B1 * 2/2002 Lee ............................ 361/760
6,612,850 B2 * 9/2003 Dai ............................ 439/55
6,731,515 B2 * 5/2004 Rhoads ....................... 361/796
6,781,848 B2 * 8/2004 Farnworth et al. .......... 361/752
7,103,753 B2 * 9/2006 Crane, Jr. .................... 712/33

* cited by examiner

*Primary Examiner*—Jeremy C Norris
*Assistant Examiner*—Yuriy Semenenko

(57) ABSTRACT

A modular DIMM carrier and riser slot device includes a slot section having a slot configured to hold a plurality of memory device planars, a first latch disposed at a first end of the slot section and pivotably connected to the slot section and capable of securing a first end of the memory device planars; a second latch disposed at a second end of the slot section and pivotably connected to the slot section and capable of securing a second end of a first memory device planar, and a third latch pivotably connected to the slot section and disposed intermediate between the first and the second latches, the third latch capable of securing a second end of a second memory device planar. The slot section has an auxiliary slot section defined as an section between the second latch and the third latch. The auxiliary slot section includes a notch for receiving the third latch when the third latch is in a disengaged position, a retention notch that restrains movement of the third latch when the third latch is in an engaged position, and a power and signaling section that includes power and signaling connections usable by one or more of the memory device planars.

9 Claims, 7 Drawing Sheets

MODULAR DIMM CARRIER AND RISER SLOT

BACKGROUND

Modern microprocessor systems can support a large number of memory modules, generally known as dual inline memory modules (DIMM), directly attached to the microprocessor. DIMMs conventionally are installed on a planar, such as a motherboard, using slotted enclosures with latches at opposites ends of the slots. These slotted enclosures are only able to accommodate one DIMM, and are designed to hold a specific DIMM type. FIG. 1 is a side view of a conventional single-DIMM carrier 10. The carrier 10 includes DIMM latches 12 at opposite ends of slot 11. The latches pivot into place to securely hold a DIMM (not shown). The carrier 10 attaches to a planar. Such as a printed circuit board, using pins 13.

DESCRIPTION OF THE DRAWINGS

The detailed description will refer to the following drawings in which like numerals refer to like items, and in which.

DETAILED DESCRIPTION

Figure 2:
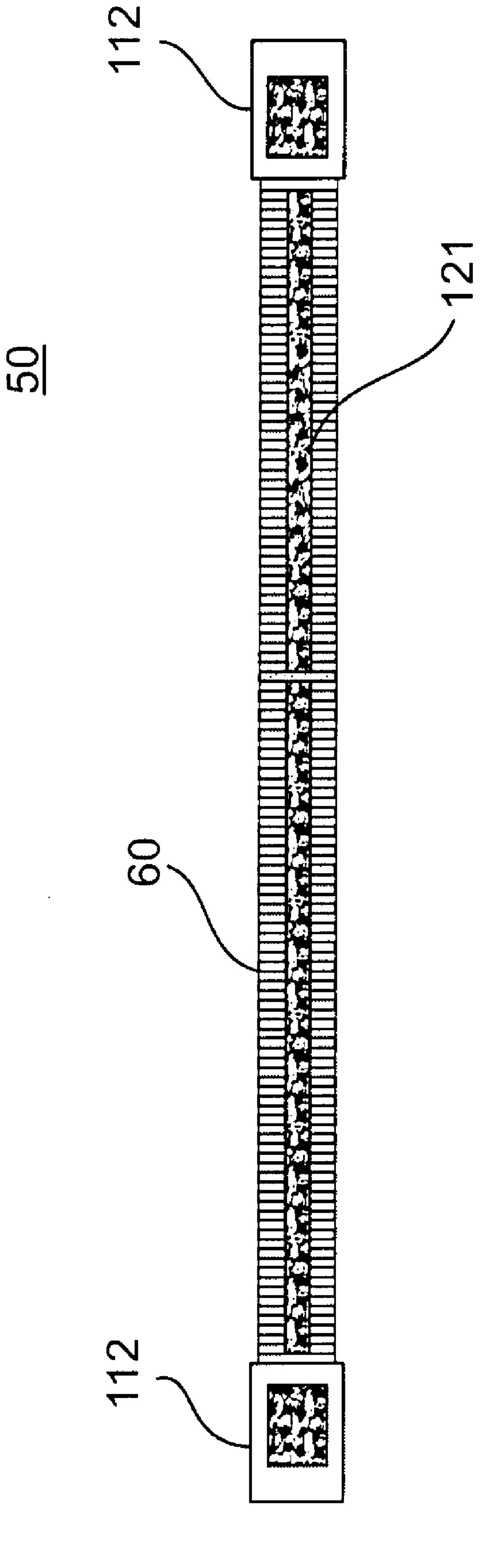
FIG. 2 is a top view of an exemplary DIMM carrier.

FIG. 2 is a top view of an exemplary DIMM carrier 50 that can be used in conjunction with a riser card, described later in detail, so as to increase the memory capacity of an accompanying computer system. The DIMM carrier 50 includes DIMM latches 112 at opposite ends of the DIMM carrier 50, and a slot section 60 having slot 121 designed to accommodate a memory device planar such as a DIMM.

Figure 3:
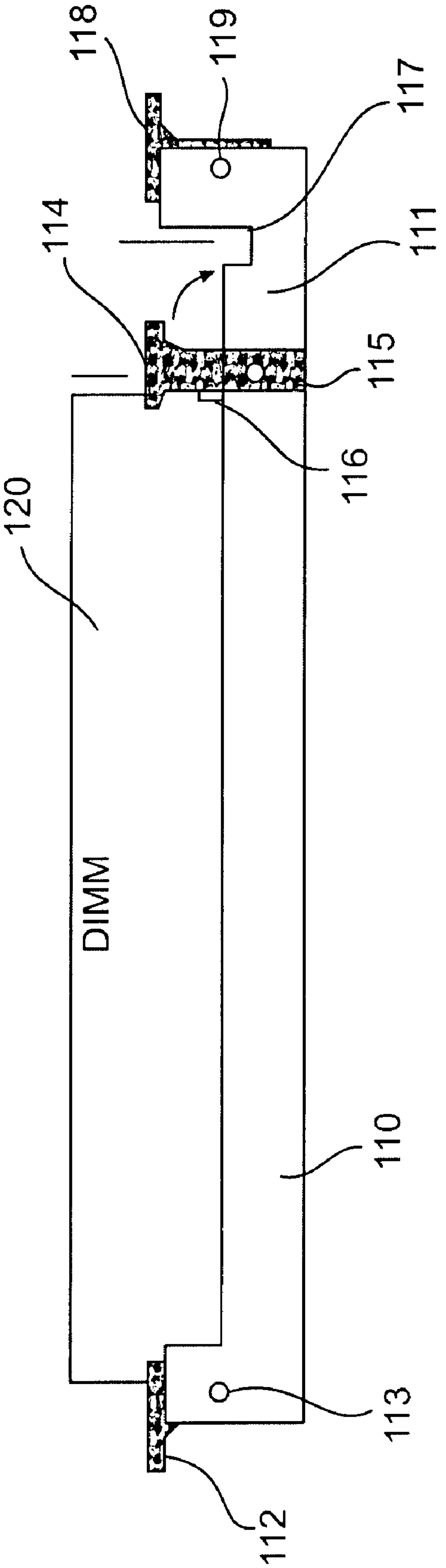
FIG. 3 is a side view of another exemplary modular DIMM carrier.

FIG. 3 illustrates, in side view, an exemplary modular DIMM carrier. The modular DIMM carrier 100 includes slot section 110 extending lengthwise and into which, DIMM 120 is inserted. In the example shown in FIG. 3, the DIMM 120 can be any type of DIMM, such as a standard fully buffered (FB)-DIMM. At one end of slot section 110, DIMM latch 112 is used to secure the DIMM 120. The DIMM latch 112 is configured to pivot about pin 113 so as to securely hold one end of the DIMM 120. For many DIMM designs, such as the FB-DIMM, a second DIMM latch 114, disposed near an end of the slot section 110 away from the DIMM latch 112, is designed to pivot about pin 115 and to be held in a closed (locking, or engaged position—as shown in FIG. 3) by engagement with retention notch 116.

Figure 1:
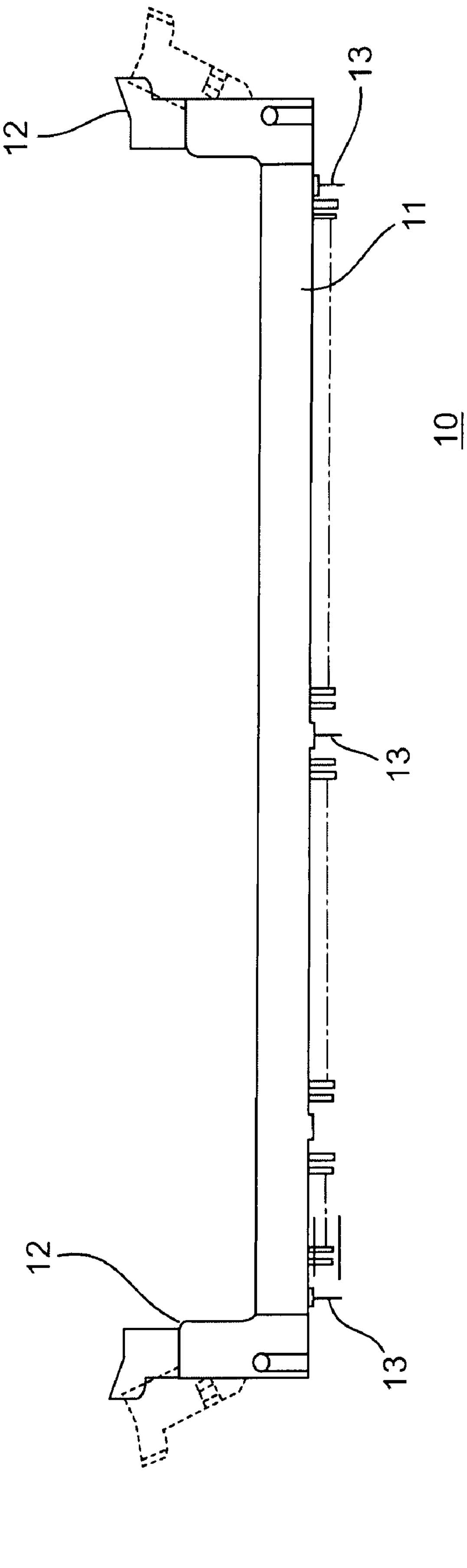
FIG. 1 (PRIOR ART)
FIG. 1 illustrates a conventional DIMM carrier.

Extending lengthwise beyond the engaged DIMM latch 114 is auxiliary slot section 111. Slot section 111 includes notch 117 into which the DIMM latch 114 may be placed when the DIMM latch 114 is not to be used, and instead, a DIMM riser card (not shown) or other DIMM design is to be inserted into the modular DIMM carrier 100. At an extreme end of the slot section 111, a second latch 118, which is configured to pivot about pin 119, is used to securely hold an end of the riser card or other DIMM design. In a practical application, the modular DIMM carrier 100 is two to three cm longer than the DIMM carrier 10 shown in FIG. 1. The additional length accommodates the auxiliary slot section 111. In addition to containing the second latch 118, the slot section 111 also houses 130 additional power connections (for example, eight connection, each with a 12 volt power connection and a ground) plus a plurality of side band signals for specific ASICS that may be installed on the riser card, and a plurality of reserved pins for future DIMM implementations (see FIG. 4B).

Figure 4A:
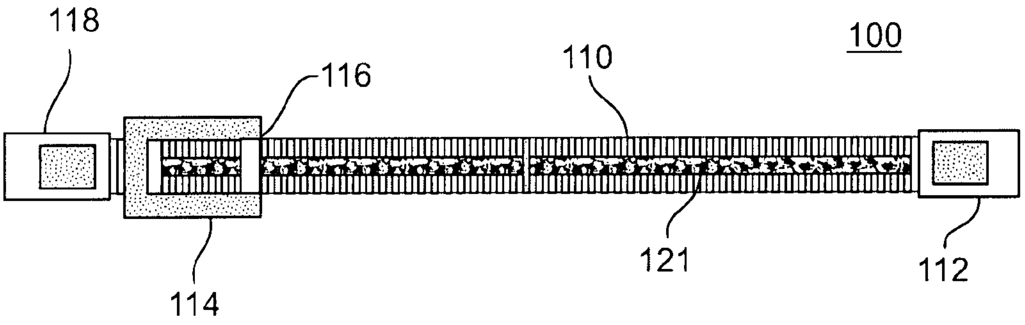
FIGS. 4A-4C illustrate alternate configurations of the modular DIMM carrier of FIG. 3.

FIG. 4A is a top view of the modular DIMM carrier 100 of FIG. 3, without a DIMM installed in slot 121. As illustrated, the modular DIMM carrier 100 shows the DIMM latch 114 in the disengaged, or down, position so as to accommodate a riser card, or other design DIMM. That is, the DIMM latch 114 is inserted into notch 117 (see FIG. 3).

Figure 4B:
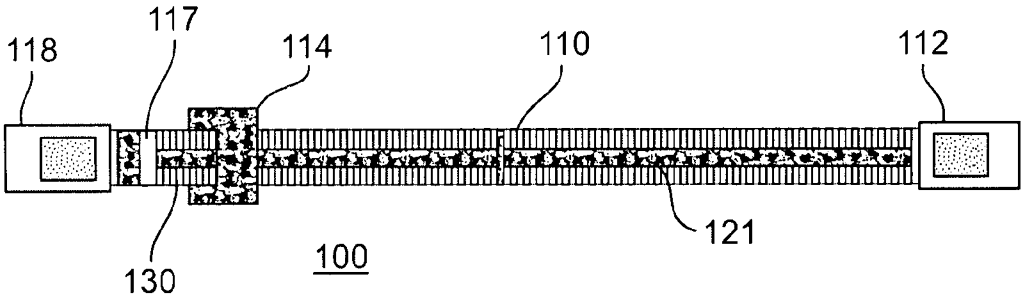

FIG. 4B illustrates the modular DIMM carrier 100 with the DIMM latch 114 in the engaged, or up, position so as to securely hold a FBDIMM, for example, in place. with the DIMM latch 114 engaged, a top view of slot section 111 is shown with power housing 130 that contains the additional power connections, side band connections, and reserved pins.

Figure 4C:
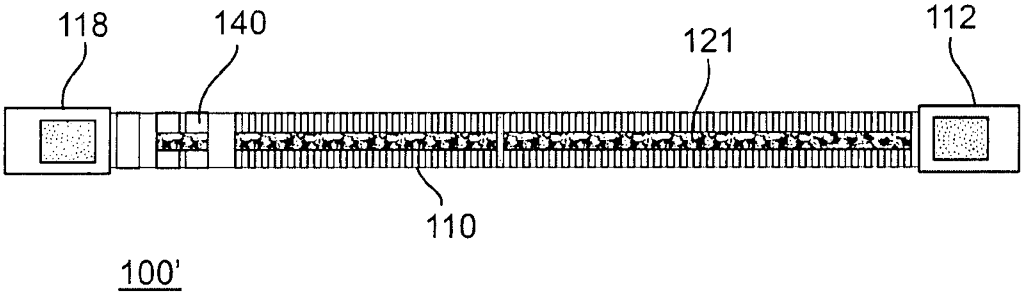

FIG. 4C illustrates an alternate exemplary configuration of a modular DIMM carrier 100'. The DIMM carrier 100' is configured to accommodate a larger memory device and includes blade-style power connector section 140 having multiple connectors for 12 volt power and ground. The large flat blade-style conductors allow for significantly more current than a conventional power pin. In this case, only two power connections and two ground connections, plus 4 to 8 signal pins would be needed. As illustrated, the modular DIMM carrier 100' is configured without the DIMM latch 114.

Figure 5:
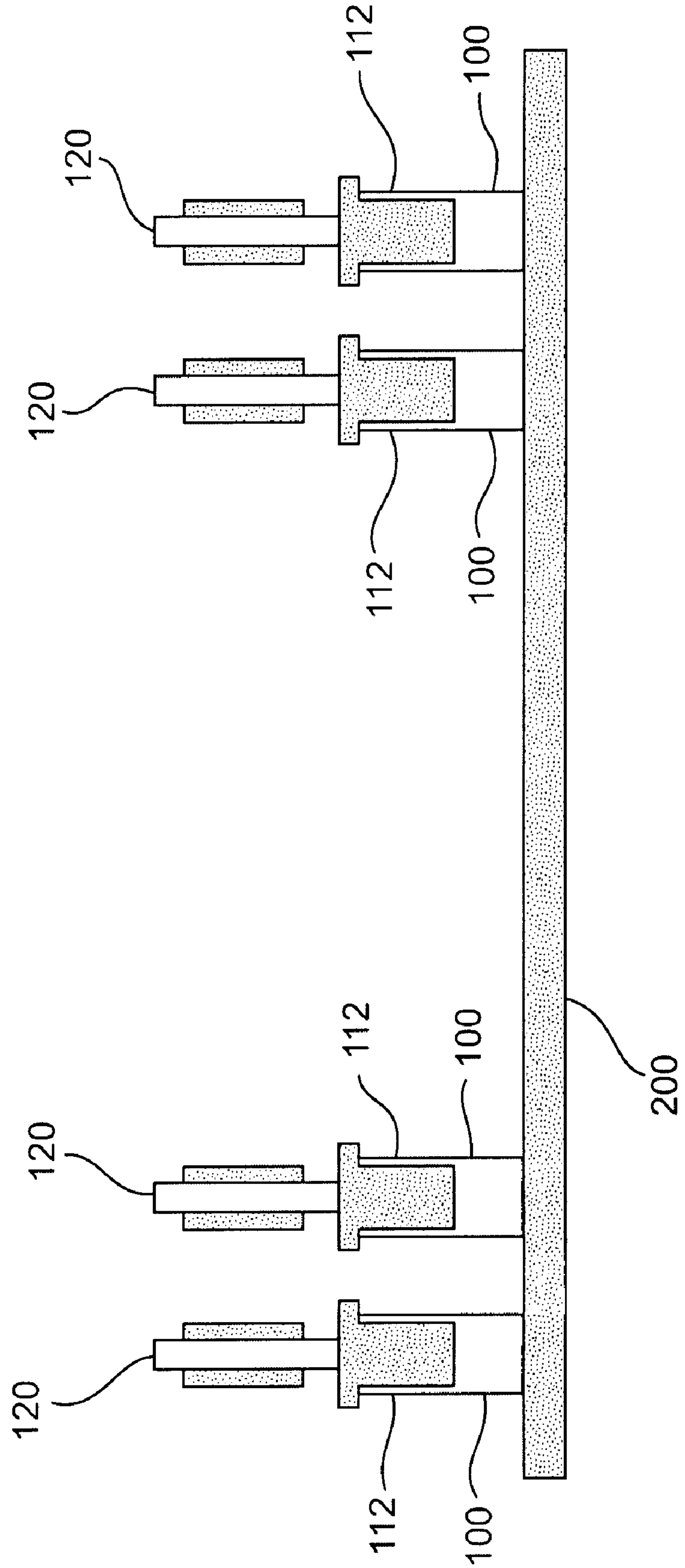
FIG. 5 illustrates an exemplary configuration of the modular DIMM carriers on a planar.

FIG. 5 illustrates a planar 200, such as a printed circuit board, onto which are affixed four DIMM carriers 100. The DIMM carriers 100 each house one FB-DIMM 120. Other configurations of modular DIMM carriers 100 also are possible.

The modular DIMM carrier 100 can accommodate a standard FB-DIMM without modification to the DIMM carrier 100 and the power extension (auxiliary slot section 111) would be unused. The modular DIMM carrier 100 also can accommodate a riser card. Such a riser card would be longer than the FBDIMM, and longer than any conventional DIMM slot can accommodate. The riser card draws power from the slot section 111, specifically the power housing 130 with its additional power connections. The riser card includes a power converter that converts the power provided through the power housing 130 to the required voltage, providing 100 watts or more of power than the conventional DIMM carrier. The modular DIMM carrier 100 also can accommodate other riser cards engineered for later generation DIMMs, such as DDR3 DIMM.

Figure 6:
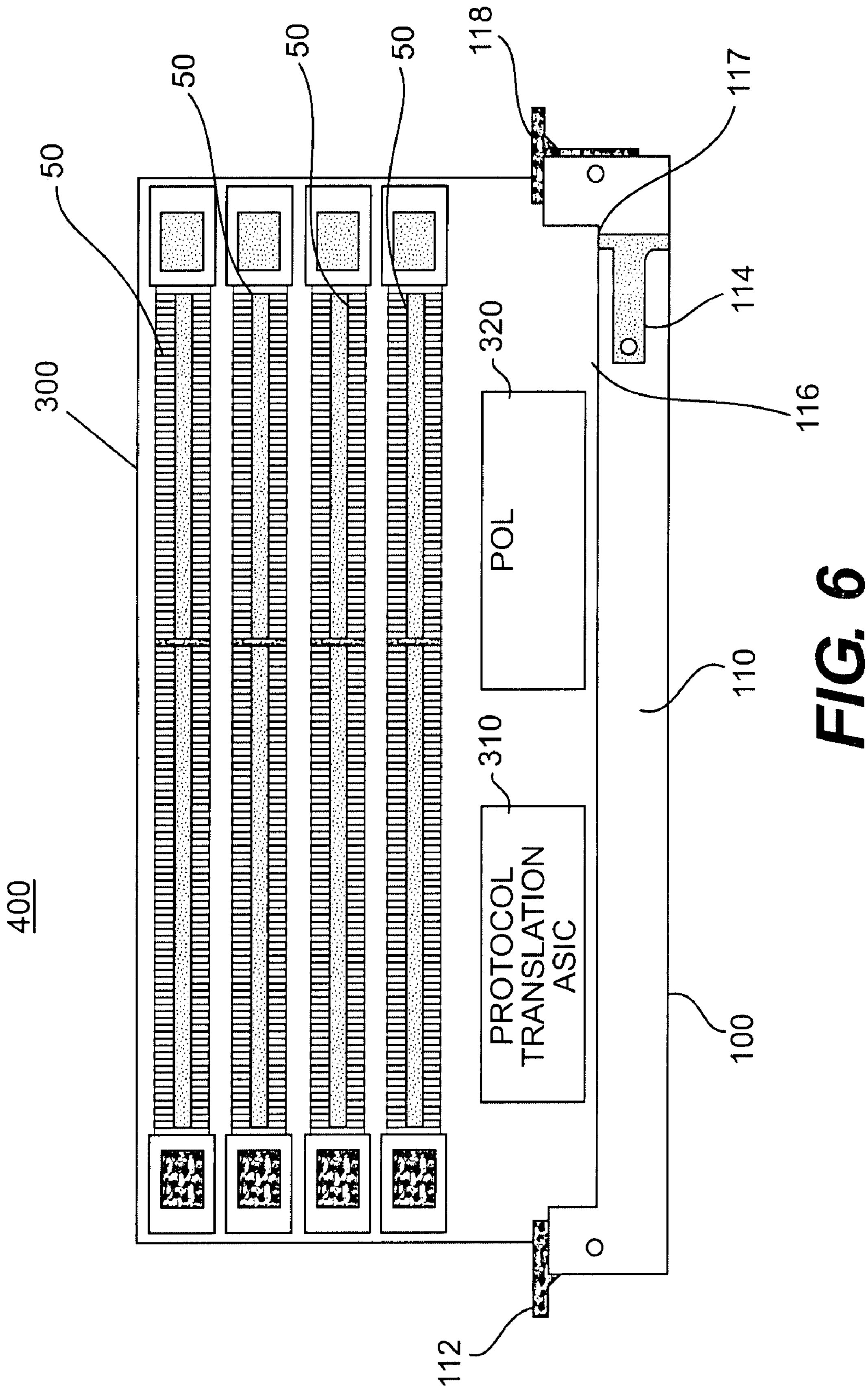
FIG. 6 is a side view of an exemplary riser card used with the modular DIMM carrier of FIG. 3.

FIG. 6 illustrates, in side view, an exemplary memory installation 400 with riser card 300 housed in the modular DIMM carrier 100 and held in place by the DIMM latches 112 and 118. The DIMM latch 114 is in the down position to accommodate the longer length riser card 300. Shown on the side of the riser card 300 are four DIMM carriers 50, each capable of accommodating a FB-DIMM or a later generation DIMM.

Also shown in FIG. 6 are protocol translation ASIC 310 and point-of-load (POL) converter 320. The ASIC 310 provides protocol translation services between the host computer system to which the DIMM carrier 100 is coupled and memory devices (DRAM devices) installed on the DIMMs supported by the riser card 300. The ASIC 310 can be pre-programmed to accommodate known memory protocols. In this embodiment, the ASIC 310, in conjunction with a memory controller (not shown in FIG. 6) can automatically determine the correct protocol for use in communications with the memory devices. Alternately, a user or installer may be provided with options for selecting the correct protocol. In addition, the ASIC 310 may be programmed with the correct protocol after installation of the riser card 300. Because the riser card 300 includes alternate protocol programming, as memory technology evolves, the programming in the ASIC 310 can be changed. Thus, use of the riser card 300 provides cost savings and flexibility over current devices that must be replaced as memory technology evolves.

The POL converter 320 changes input DC voltage to voltage levels appropriate for the nearby memory devices. Thus, the POL converter 320 receives power from the auxiliary section 111 of the DIMM carrier 100 (see FIG. 3) and provides converted power to the DIMMs, as well as the ASIC 310, and any other ASICs or devices on the riser card 300 that require electrical power.

The riser card 300 also includes mechanisms to notify the host computer system when the riser card 300 is installed, the numbers and types of installed memory devices, status of the ASIC 310, and status of the power mechanism (for example, the POL 320 and the power housing 130—see FIG. 3). The ASIC 310, using an I2C bus, for example, can report memory device inventory, riser card 300 installation, and status of the ASIC 310, itself. The POL converter 320 can report power conditions using the same or a similar I2C bus. Since the POL converter 320 is responsible for powering up and powering down any ASIC on the riser card 300, as well as the installed memory devices. The POL converter 320 may report power conditions upon host computer system boot up and shutdown.

Figure 7:
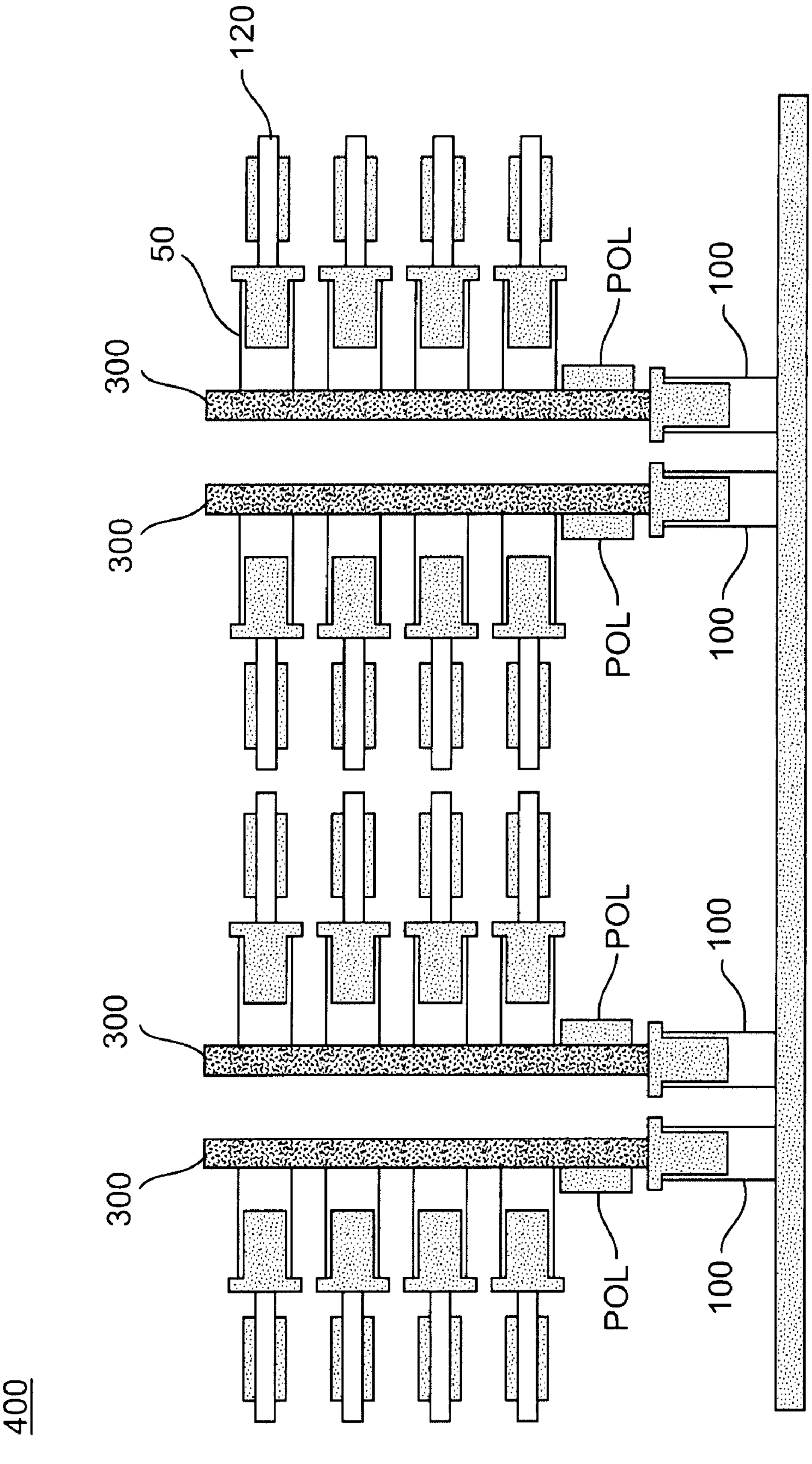
FIG. 7 illustrates an exemplary configuration of the riser cards of FIG. 6.

FIG. 7 is an end view of the memory installation 400 showing the coupling of four riser cards 300 to respective modular DIMM carriers 100. Each riser card in turn houses four DIMM carriers 50, such that the memory installation 400 comprises a total of 16 DIMMs 120.

The modular DIMM carrier 100 is capable of accommodating current FBDIMM, and other memory architectures, and, in conjunction with the riser card 300, can offer a flexible solution to housing current memory architectures and to-be-developed memory architectures.

We claim:

1. A modular memory device for housing a plurality of memory planar types, comprising:

a first slot section receiving a first type of memory planar;

an auxiliary slot section coupled to the first slot section, wherein the first and the auxiliary slot sections together form a slot to house a second type of memory planar; and latch means adjustable to restrain both the first and the second type of memory planar, wherein the latch means comprise:

a first latch disposed at a first end of the first slot section and pivotably connected to the first slot section to secure a first end of the first and second type of memory planars;

a second latch disposed at a second end of the first slot section and a first end of the auxiliary slot section and pivotably connected to the first slot section to secure the second end of the first type of memory planar; and a third latch disposed at a second end of the auxiliary slot section and pivotably connected to the auxiliary slot section to secure the second end of the second type of memory planar.

2. The device of claim 1, wherein the first type of memory planar is a DIMM and the second type of memory planar is a riser card.

3. The device of claim 2, wherein the riser card comprises:

means for housing a plurality of memory devices; and means for receiving electrical power and converting the received electrical power to match power requirements of the memory devices.

4. The device of claim 3, wherein the memory devices are DIMMs.

5. The device of claim 1, wherein the auxiliary slot section comprises:

a notch for receiving the second latch when the second latch is in a disengaged position, a retention notch that restrains movement of the second latch when the second latch is in an engaged position, and a power and signaling section that includes power and signaling connections usable by the memory planars.

6. The device of claim 2, wherein each riser card comprises a protocol translation ASIC, the protocol translation ASIC comprising:

translation protocols specific to one or more installed memory device types; and means for automatically determining a correct protocol based on the installed memory device types.

7. The device of claim 2, wherein each riser card comprises a protocol translation ASIC, the protocol translation ASIC comprising:

translation protocols specific to one or more installed memory device types;

means for selecting a correct protocol based on the installed memory device types; and means for updating protocol programming of the protocol translation ASIC.

8. A carrier for modular DIMMs and riser cards, comprising:

means for securely holding a DIMM, comprising:

a first latch disposed at a first end of a first slot section and pivotably connected to the first slot section to secure a first end of the DIMM; and a second latch disposed at a second end of the first slot section and a first end of an auxiliary slot section and pivotably connected to the first slot section to secure the second end of the DIMM;

means for securely holding a riser card, comprising:

the first latch pivotably connected to the first slot section to secure a first end of the riser card; and a third latch disposed at a second end of the auxiliary slot section and pivotably connected to the auxiliary slot section to secure the second end of the riser card; and means for supplying power to the riser card.

9. The carrier of claim 8, further comprising;

means for identifying memory devices affixed to the riser card;

means for translating between the memory devices and a host computer system; and means for reporting a status of the means for supplying power and the means for translating.

* * * * *